United States Patent [19]

Röll et al.

[11] Patent Number: 5,022,976

[45] Date of Patent: Jun. 11, 1991

[54] PROCESS AND JIG FOR PLATING PIN GRID ARRAYS

[75] Inventors: Rudolf Röll, Marktredwitz; Jürgen Brandenburger, Selb; Horst Hempel, Marktredwitz, all of Fed. Rep. of Germany

[73] Assignee: Hoechst CeramTec Aktiengesellschaft, Selb, Fed. Rep. of Germany

[21] Appl. No.: 330,140

[22] Filed: Mar. 29, 1989

[30] Foreign Application Priority Data

Mar. 31, 1988 [DE] Fed. Rep. of Germany ....... 3810992

[51] Int. Cl.$^5$ .............................................. C25D 17/06
[52] U.S. Cl. ................................................. 204/297 R
[58] Field of Search ..................................... 204/297 R

[56] References Cited

U.S. PATENT DOCUMENTS 3,518,756 7/1970 Bennett et al. ...................... 29/625
4,032,414 6/1977 Helder et al. ........................ 204/15

Primary Examiner—T. M. Tufariello
Attorney, Agent, or Firm—Foley & Lardner, Schwartz, Jeffery, Schwaab, Mack, Blumenthal & Evans

[57] ABSTRACT

A receiving jig for PGAs comprises a rectangular baseplate made of a corrosion-resistant metal which has at least one hole. The lengths of the edges of the base-plate have at least the dimensions of the PGA housing. Arranged on the metal baseplate are bars parallel to the surface at equidistant spacings and the height of the bars above the baseplate is at least half the length of the pins of the PGAs. The spacing between two bars on the surface of the baseplate corresponds to twice the spacing between two adjacent rows of pins on the PGA. There should be at least enough bars present to make contact with all the pins of the PGA.

23 Claims, 2 Drawing Sheets

PROCESS AND JIG FOR PLATING PIN GRID ARRAYS

The invention relates to a process for plating pin grid arrays (PGAs) and a receiving jig for PGAs. The process according to the invention is based on the use of said receiving jig for PGAs which is so designed that PGAs to be plated can be clipped on, with it being possible to reliably make contact to all the pins, and plated uniformly in an electroplating bath.

Since it has become possible to continuously increase the integration density of semiconductor circuits, the requirements imposed on the housings which receive such circuits have also increased continuously. Thus, an allotment of 225 contacts and over on a silicon chip measuring approx. 1 $cm^2$ to an equally large number of contact pins is now no longer a rarity. It is possible to lay the conductor track from the edge of the silicon chip to a previously determined contact pin on the housing, for example, using the so-called multilayer technique in which the conductor tracks are laid above each other in several levels, possibly with interconnections. Owing to the superior material properties of ceramics, in particular $Al_2O_3$ ceramics, such pin grid arrays are nowadays manufactured predominantly from this material. The manufacture of said PGAs is expensive since it comprises several sequentially arranged operational steps. A procedure, described as the "cofired technique", for producing multilayer ceramic housings is, for example, described in U.S. Pat. No. 3,518,756.

In particular, in the case of PGAs, on which very high requirements are imposed in subsequent use, it is not possible to dispense with gold-plating the visible, exposed conductor tracks and the connecting pins. This plating is carried out chemically or, preferably, by electrodeposition. A considerable hazard in this process step (usually the last one) in manufacturing a PGA is that correct electrical contact is not made to individual pins or parts of conductor tracks and they are consequently not coated with the required gold layer in the electroplating bath. Subsequent plating is very complicated in terms of process engineering and is, as a rule, too expensive, with the result that such incompletely plated PGAs (even when only a single pin is involved) have to be regarded as reject. However, compared with rejects in preceding process steps, a reject in the final process step means, on the other hand, a disproportionately high increase in the price of the products.

For the electrodeposition of gold or other metals from corresponding metal salt baths, an electrical contact is essential between all the areas to be plated and the cathode.

According to the prior art, this contact is made via one or more short-circuit rings which are provided in one or more layers of the multilayer PGA and connect all the printed conductor tracks of said layer to each other. These short-circuit rings are brought to the outside where electrical contact can then be made to them. A plurality of PGAs to which contact is made in this way is then clamped to an electroplating rack, an electrical contact being made to the rack which is directly connected in turn to the cathode, and the electrodeposition of metal then takes place in an electroplating bath.

The short-circuit ring has to be removed after completing the electrodeposition. This may be carried out, for example, by sawing or nicking beforehand and breaking. The subsequent removal of the short-circuit ring by breaking up the fired ceramic, for example, by sawing, lazer cutting, water-jet cutting or the like is very complicated and expensive. Although nicking in the unfired state and breaking off the short-circuit ring after firing and gold-plating is cheaper, it results in imprecise edges of fracture and chipping or the like owing to the brittle properties of the ceramic and consequently in rejects. Any subsequent working of the edge is again very cost-intensive.

Furthermore, after the short-circuit ring has been removed, the emerging metallic connection is always visible at the side edge of the PGA. In the subsequent processing steps such as mounting the semiconductor chip, further electroplating processes or subsequent use of the finished electronic component, this may result in short-circuits.

The area in each layer to be metallized increases owing to the connection of every individual conductor track outwards to the short-circuit ring. This affects the electrical characteristic data, for example the capacitances. In the housings, however, the smallest possible capacitances between the individual layers and between the conductor tracks is desirable in order to keep any mutual interaction of the signal transmission as small as possible.

In the construction of parts having a short-circuit ring, the areal proportion of the short-circuit ring occupies 20-50% of the area of the housing, depending on type and design. The additional area has to be carried through all the operational steps from the beginning to the gold-plating, and the production capacity of all the operational steps, for example printing of the conductor tracks, firing of the housings or electrodeposition of metal is reduced by this percentage or the costs are increased.

For the abovementioned reasons, the object arose of finding a process for plating PGAs which does not employ a short-circuit ring in the PGA and consequently eliminates the abovementioned disadvantages.

This is, for example, achieved by making electrical contact via the pins (contact pins) which are all short-circuited. In this case a short-circuit ring is no longer necessary in the PGA.

U.S. Pat. 4,032,414 describes a jig for plating two-row pinstrips (for example, dual-in-line housing). In this case, the pinstrips are mechanically clamped onto an electrically conducting terminal bar and then conveyed by means of a conveyor belt through various electroplating baths and finally pulled off the electrically conducting bar again, also mechanically. Even with the two-row pinstrips described, however, there is the risk that, if one or more pins are bent outwards before clipping onto the terminal bar, there is no guarantee of electrical contact via all the pins. An attempt is made in a further development of the invention to counteract this disadvantage by pressing the double row of pins not only onto one terminal bar but by additionally pressing the two rows of pins from the outside with two further bars onto the terminal bar situated on the inside. This requires, however, a further jig with a spring mechanism which has to be opened before the pinstrips are clipped on and has to be closed after the pinstrips have been positioned on the inner terminal bar, the two rows of pins being pressed against the inner terminal bar. The inner terminal bar may also be wedge-shaped.

This process is unsuitable for plating pin grid arrays since it is either impossible to ensure a reliable contact to all the pins (and this is a considerable disadvantage in the case of the substantially more expensive multilayer PGAs) or the jig which makes reliable contacting possible is constructionally too complicated and consequently makes the entire process uneconomical.

The present invention therefore relates to:

A process for plating pin grid arrays (PGAs), which comprises prebending the pins of the PGA in a prebending jig, then clipping them onto a receiving jig for PGAs, a short-circuit being produced over all the pins by means of round or wedge-shaped bars or by means of metal pegs which are clamped between at least two pins, the metal pegs or metal bars being mounted on a metal plate arranged as far as possible at right angles to the pins, attaching the receiving jig with a PGA mounted on it or a plurality of receiving jigs with PGAs mounted on them in an electrically conducting manner to an electroplating rack, connecting the electroplating rack to the cathode and immersing it in an electroplating bath, the metal being deposited on the electrically conducting areas making contact with the cathode and subsequently, after the electroplating rack has been removed from the electroplating bath, detaching the receiving jigs from the electroplating rack and pulling the plated PGAs off the receiving jig.

Furthermore, the invention relates to:

A receiving jig for PGAs which comprises a rectangular metal baseplate made of a corrosion-resistant material, the lengths of the edges of the metal baseplate having at least the dimensions of the PGA housing, and wherein a) bars are arranged on the metal baseplate parallel to the surface of the metal baseplate at equidistant spacings and the height of the bars above the metal baseplate is at least half the length of the pins of the PGAs and the cross-section of the bars is 0-5% larger than the spacing of two adjacent rows of pins on the PGA and the spacing between two bars on the surface of the metal baseplate corresponds to twice the spacing of two adjacent rows of pins on the PGA and at least enough bars are present to make contact to all the pins of the PGA, or wherein b) there project out of the metal baseplate metal pegs whose length is at least half the length of the pins of the PGAs and whose cross-section at least in the upper third is 40-45% larger than the spacing of two adjacent rows of pins on the PGA and the spacing between two adjacent pegs on the metal baseplate corresponds to twice the spacing of two adjacent rows of pins on the PGA and at least enough pegs are present to make contact to all the pins of the PGA, and wherein the metal baseplate has at least one hole both in the embodiment a) and in the embodiment b).

The preferred embodiments of the present invention will hereinafter be described with reference to the appended drawings, wherein.

Plating is understood to mean the chemical deposition or electrodeposition of metals on suitable surfaces. In the process according to the invention, the pins of the PGA are short-circuited on clipping onto the receiving jig according to the invention, with the result that all the pins and all the exposed conductor tracks connected thereto are provided with a metal coating in the electroplating bath.

Figure 1:
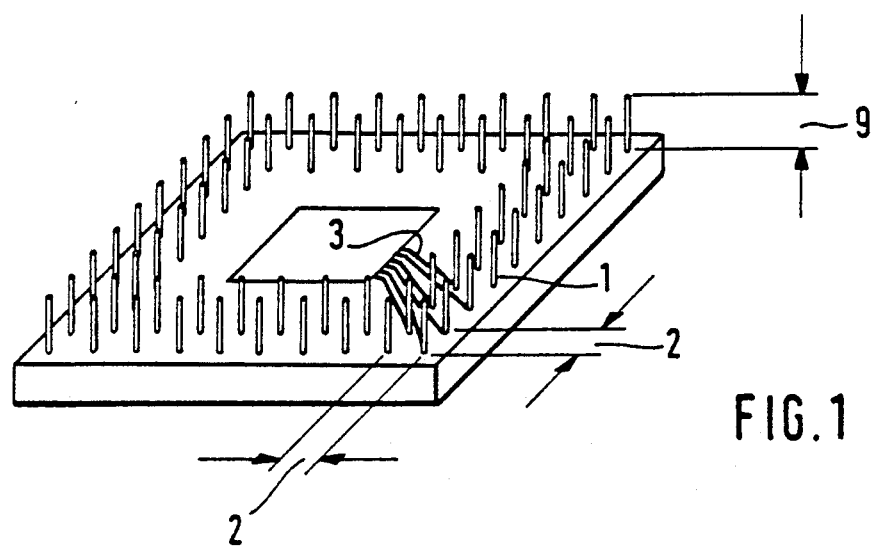
FIG. 1 is a perspective view of a PGA which can be plated according to the present invention.

PGAs which can be plated with the process according to the invention using the receiving jig according to the invention comprise, as a rule, a rectangular ceramic housing, a few millimeters thick, on which pins are arranged at equidistant spacings parallel to the edges of the housing on one face. An exemplary embodiment of such a PGA is shown in FIG. 1. In this case, 64 connecting pins (1) are arranged in double rows of pins parallel to the edges. The spacings between two adjacent pins (2) (always measured parallel to the edges of the housing) are equal. Larger PGAs have three, four or even more rows of pins with equidistant spacings arranged parallel to the edges of the housing. The conductor tracks (3) run either on the surface of the housing (SLAM version) on which the pins are mounted or, alternatively, on intermediate planes of the PGA produced by multilayer technology.

Figure 2:
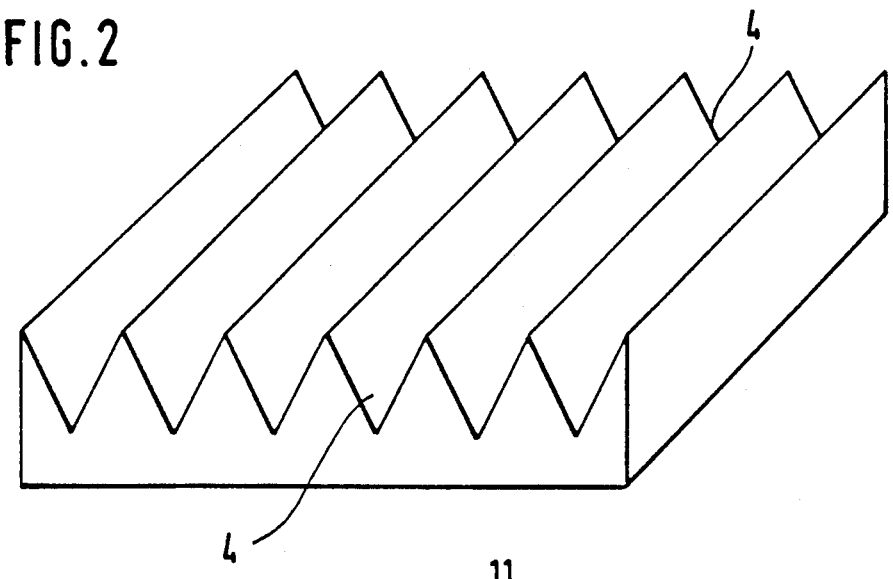
FIG. 2 is a perspective view of a prebending jig used in the present invention.

The pins are generally composed of nickel/iron or nickel/iron/cobalt alloys and are bendable. This bendability is utilized to prebend the pins of the PGA before clipping it onto the receiving jig so that they exert a clamping action on the bars or pegs of the receiving jig. In addition, the prebending of the pins has the advantage that even slightly deformed pins which would result in a reject PGA as a result of failure to make contact with the cathode are bent again into the correct direction. Such a prebending station is shown in FIG. 2. By pressing the PGA into the channels (4) which taper downwards in a v-shape, the rows of pins are pressed towards each other. Preferably, the PGA is pressed into the prebending jig twice, the PGA being rotated through 90° the second time. Another possibility is to position two prebending jigs behind each other which are rotated through 90° with respect to each other and to pass the PGA in sequence through the two stations.

The PGA prebent to this extent can now be clipped onto the receiving jig, a reliable contact being guaranteed between the pins and the bars or pegs of the receiving jig.

The receiving jig according to the invention comprises a corrosion-resistant metal baseplate which is preferably manufactured from titanium or V4A steel. The dimensions of said metal baseplate in length and width should at least correspond to those of the PGA housing, and it is advantageous if the length and the width of the metal baseplate exceed those of the PGA housing by 1 to 4 mm in each case. The thickness of the plate is not critical but should be so dimensioned that an adequate mechanical rigidity is guaranteed. Thicknesses of 1–8 mm have proved advantageous.

Figure 3:
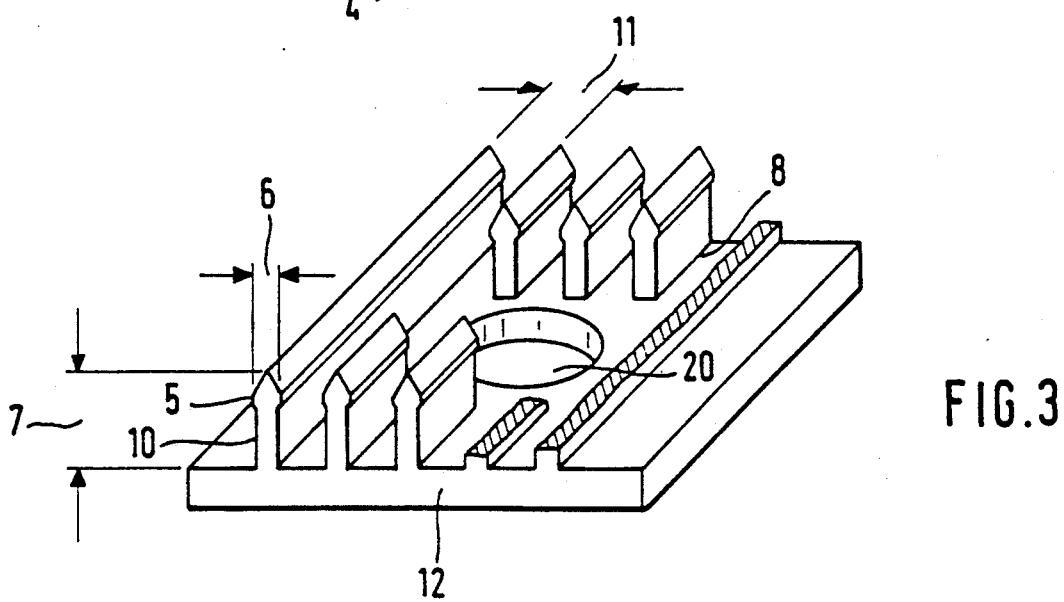
FIG. 3 is a perspective view of a first embodiment of a receiving jig according to the present invention.

Metal bars (preferably of the same material as the metal baseplate) are then arranged on said metal baseplate preferably parallel to two opposite edges of the metal baseplate (see FIG. 3). Said bars (5) may be round, but are preferably wedge-shaped. the wedge-shape of the bars being so pronounced that the wedge tapers away in a direction perpendicular to the metal baseplate (12); its point therefore projects above the baseplate. In the case of wedge-shaped bars, the base (6) of the wedge (i.e., the maximum vertical extension of the wedge parallel to the surface of the metal baseplate) should be 0-5% larger than the spacing (2) of two adjacent rows of pins. This achieves the result that the double row of pins is resiliently spread apart when the PGA is clipped on and this results in the required clamping adhesion. In the case of round bars, the cross-section should be 0-5% larger than the spacing of two adjacent rows of pins. The height (7) of the metal bars above the baseplate should be so dimensioned that the bars extend far enough into the gap between a double row of pins to achieve a good clamping action. It has proved advantageous if the height (7) of the metal bars (measured from the bottom edge (8) of the bars) above the baseplate is at least half the length (9) of the pins of the PGA; in the case of the preferably used wedge-shaped bars, the base (6) of the wedge should be at least at a height above the metal baseplate which corresponds to half the length of the pins of the PGA. The bars are mounted, for example, in a manner such that the bars are securely joined to webs (10) which are in turn anchored on the metal baseplate. In a preferred embodiment of the invention, the bars (5) and webs (10) are machined as one piece from the metal baseplate. The spacing of two bars (11) from each other (for example, measured from the wedge tip of one bar to the wedge tip of an adjacent bar) corresponds to double the spacing (2) of a double row of pins. The total number of metal bars arranged on the surface of the metal baseplate depends on the number of double rows of pins on a PGA along or perpendicular to one edge of the PGA. In the case of the 64 pin grid array shown in FIG. 1, 5 bars are required to make contact to all the pins.

Figure 4:
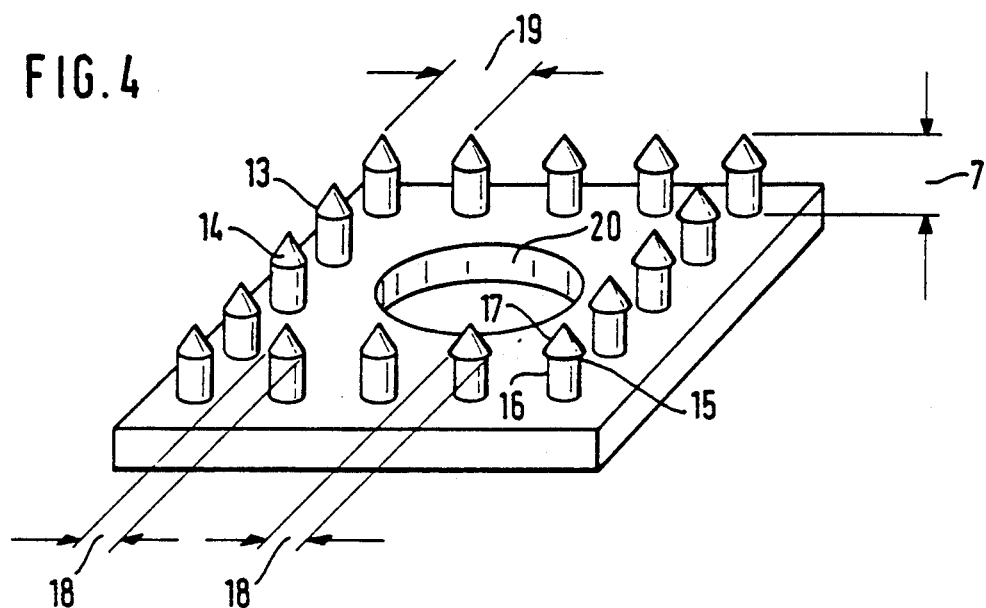
FIG. 4 is a perspective view of a second embodiment of a receiving jig according to the present invention.

In another embodiment according to the invention of the receiving jig, metal pegs project perpendicularly out of the metal baseplate and these are preferably manufactured from the same material as the metal baseplate. The pegs each make contact to four pins of a double row of pins (see FIG. 4). The metal pegs (13) may have a polygonal, i.e., for example, a tetragonal, a pentagonal, a hexagonal or a heptagonal cross-section or a round cross-section. In a preferred embodiment, the upper third of the pegs tapers conically. Particularly preferably, the metal pegs are formed with a mushroom shape (15), i.e. they comprise a lower, cylindrical section (16) and an upper, conical section (17) firmly joined to the lower section. At the same time, the cross-section of the lower, cylindrical section is less than the diameter of the base circle of the cone.

The height (7) of the metal pegs above the baseplate (12) should be so dimensioned that the pins extend far enough into the gap between 4 adjacent pins of a double row of pins to achieve a good clamping action. It has proved advantageous for the height (7) of the metal pegs above the baseplate (12) to be at least half the height of the length of the pins of the PGA. The maximum cross-section (18) of the metal pegs is (at least in the upper third of the pegs) 40-45% larger than the spacing (2) of two adjacent rows of pins. The spacing (19) of two pegs from each other (for example, measured from the cone tip of one peg to the cone tip of the immediately adjacent peg) corresponds to twice the spacing (2) of a double row of pins. The total number of the metal pegs arranged on the surface of the metal baseplate depends on the number of four-pin squares along the double rows of pins on a PGA. There are 16 such four-pin squares along the edge of the PGA housing in the 64-pin PGA shown in FIG. 1, with the result that 16 pegs have to be provided on the receiving jig along the edges.

If a PGA to be plated is now clipped onto such a receiving jig (be it onto one according to FIG. 3 or according to FIG. 4) and the jig is immersed (after it has been connected to the cathode) together with the PGA in an electroplating bath in a manner such that the unoccupied side of the metal baseplate points in the direction of the anode, the metal ions have to migrate around the metal baseplate when current is flowing in order to be able to be deposited on the areas of the PGA in contact with the cathode. This may result in undesirable varying metal layer thicknesses on the outer plated areas on the one hand, and on the inner plated areas on the other hand. This so-called "shielding" by the metal baseplate can be influenced, for example, by perforating the baseplate (12) and a hole (20) is preferably drilled in the center of the baseplate (12) so as to facilitate the migration of the metal ions to the areas of the PGA situated on the inside. Suitable choice of hole size can ensure that the metal layer thickness is virtually constant on all the plated areas of the PGA. The ideal hole size can be determined by a simple series of experiments with various hole diameters.

In order to prevent unnecessary and undesirable deposition of the generally fairly expensive metals on the metallic baseplate, the entire metal baseplate, including the lower sections of the webs or metal pegs is provided with a protective coating which is inert towards the chemicals used in electroplating. For example, silicone rubber or a suitable lacquer may be used as the material for the protective coating. Advantageously, up to 50% of the height of the webs or pegs is provided with the protective coating, while the remainder projecting above that level remains exposed.

Figure 5:
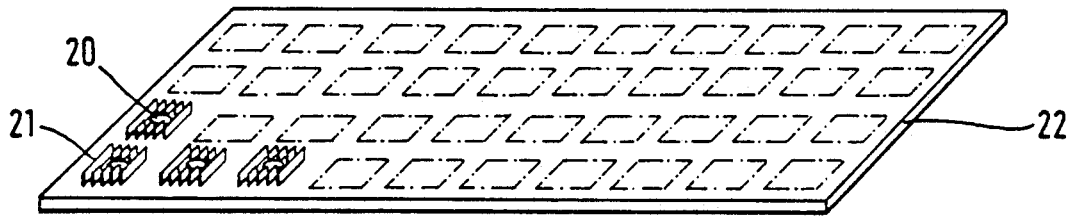
FIG. 5 is a perspective view of a further embodiment according to the present invention wherein a plurality of receiving jigs are combined to form a large plate.

In a further embodiment of the invention, a plurality of the receiving jigs described above are combined to form a fairly large plate which can receive a plurality of PGAs. This can be done, for example, by joining a plurality of receiving jigs by means of the common edges. FIG. 5 shows a multiple receiving jig of this type in which 40 individual receiving jigs (21) as shown in FIG. 3 are joined together in a 10×4 grid. Obviously, such a multiple receiving jig (22) can also be produced in one piece without individual receiving jigs having to be combined.

In producing the receiving jigs, the best procedure is either to machine the bars including the webs out of a solid metal baseplate, for example by erosion, or to drill holes with the required dimensions for the pegs in a solid baseplate and then to mount the metal pegs in said holes by known methods. The holes for influencing the shielding are drilled through the metal baseplate. The same procedure may also be adopted in producing the multiple receiving jig.

If using a silicone rubber (Wacker, RTV 533), the protective coating may, for example, be carried out by casting in a mold which contains the receiving jig, in which process the liquid silicone rubber compound is poured into the mold up to the required height of the webs or pegs (i.e. so that only a section remains uncovered).

Figure 6:
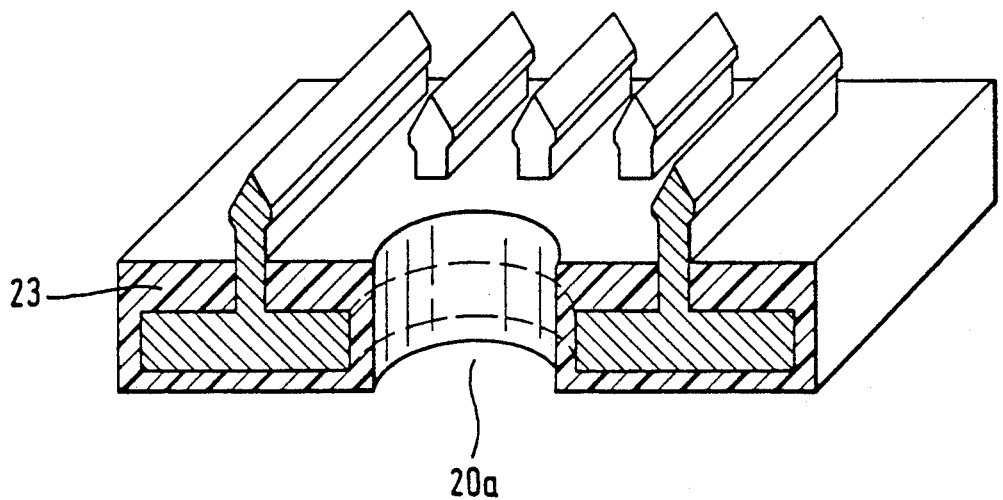
FIG. 6 is a perspective view of a receiving jig coated with silicone rubber according to the present invention.

This procedure has the advantage that the hole diameter which influences the shielding can be reduced, for example, by siting a cylindrical bolt, around which the rubber compound positions itself, at the point in the casting mold at which the shielding hole of the receiving jig is placed and at which afterwards a hole of a defined smaller size (20a) (see FIG. 6) is to be cut out of the protective coating. FIG. 6 shows a detail of such a multiple receiving jig coated with silicone rubber (23). In this case, the hole (20a) cut out of the silicone rubber has a smaller diameter than that in the metal baseplate.

In the process for plating PGAs, the best procedure is to prebend the PGAs to be plated in a prebending station with a prebending jig, for example one such as that shown in FIG. 2.

Advantageously, the PGA with its pins is either pressed twice in succession into the identically positioned prebending jig, the PGA being pressed in the second time rotated through 90° (around the center point axis which is perpendicular to the largest surface of the PGA) or two prebending jigs are positioned behind each other so that their v-shaped channels are rotated through 90° with respect to each other and the PGA is then pressed into the two prebending jigs in succession. Subsequent thereto, the PGAs are clamped onto the receiving jigs according to the invention, a short-circuit being produced over all the pins situated on the PGA by means of metal bars or pegs arranged on the metal baseplate. The receiving jigs with PGAs so mounted are now attached in an electrically conducting manner to an electroplating rack on which there is room for a multiplicity of such receiving jigs. After making contact between the electroplating rack and the cathode and immersing the rack in an electroplating bath, metal deposition takes place by known methods. After the electroplating racks are removed from the electroplating bath and after rinsing and drying, the receiving jigs are detached from the electroplating rack and the plated PGAs are pulled off the receiving jigs.

In particular, the multiple receiving jigs are suitable for partial automation of the electroplating process. Thus, the prebending of the PGAs and loading and unloading of the multiple receiving jigs can be carried out particularly well mechanically, and this leads to a further reduction in the reject rate since, in particular, tilting of the PGAs during prebending and during loading and unloading is almost completely eliminated.

We claim:

1. A receiving jig for pin grid arrays (PGAs), wherein a rectangular metal baseplate made of corrosion-resistant material whose length and width are at least equal to the length and width of a PGA housing has a plurality of regularly arranged metallic projections to which all the pins of a PGA can be securely clamped and also at least one hole.

2. The jig according to claim 1, wherein a plurality of metal bars are arranged on the metal baseplate parallel to the surface of the metal baseplate in parallel rows and the height of the bars above the metal baseplate is at least half the length of the pins of the PGAs and the cross-section of the bars is 0-5% larger than the spacing of two adjacent rows of pins on the PGA and the spacing between two bars on the surface of the metal baseplate corresponds to twice the spacing of two adjacent rows of pins on the PGA and at least enough bars are present to make contact to all the pins of the PGA.

3. A jig as claimed in claim 1, wherein there project out of the metal baseplate metal pegs whose length is at least half the length of the pins of the PGAs and whose cross-section at least in the upper third is 40-45% larger than the spacing of two adjacent rows of pins on the PGA and the spacing between two adjacent pegs on the metal baseplate corresponds to twice the spacing of two adjacent rows of pins on the PGA and at least enough pegs are present to make contact to all the pins of the PGA.

4. The jig as claimed in claim 2, wherein the bars have a cross-section in the form of a wedge which tapers in the perpendicular direction away from the baseplate.

5. The jig as claimed in claim 2, wherein the bars are seated on webs having a predetermined height.

6. The jig as claimed in claim 5, wherein the bars and webs are in one piece and are machined out of the baseplate.

7. The jig as claimed in claim 2, wherein the bars are aligned parallel to two opposite edges of the rectangular metal baseplate.

8. The jig as claimed in claim 3, wherein the metal pegs have a round cross-section.

9. The jig as claimed in claim 8, wherein the upper third of the round metal pegs is conically tapered.

10. The jig as claimed in claim 9, wherein the tapered cone of the metal peg is wider at the widest point than at the base of the metal peg.

11. The jig as claimed in claim 1, wherein the metal baseplate is manufactured from titanium or V4A steel.

12. The jig as claimed in claim 1, wherein a plurality of metal baseplates (individual baseplates) are joined mechanically to form a larger metal plate in a manner such that the lateral boundary phases of the individual baseplates are in contact with each other.

13. The jig as claimed in claim 12, wherein 40 individual baseplates are joined to form a large metal baseplate in a 4×10 grid.

14. The jig as claimed in claim 12, wherein the individual metal baseplates are clipped onto a metal rack.

15. The jig as claimed in claim 14, wherein the individual baseplates arranged in the center of the large metal plate have holes which are wider than the holes of the individual baseplates arranged away from the center.

16. The jig as claimed in claim 3, wherein the metal baseplate has a protective coating comprised of an adhesive which is inert with respect to chemicals used in electroplating, said coating extending up to 50% of the peg length.

17. The jig as claimed in claim 16, wherein the protective coating is composed of silicone rubber.

18. The jig as claimed in claim 3, wherein the metal pegs are comprised of titanium or V4A steel.

19. The jig as claimed in claim 2, wherein the metal bars are comprised of titanium or V4A steel.

20. The jig as claimed in claim 5, wherein the webs are comprised of titanium or V4A steel.

21. The jig as claimed in claim 5, wherein the metal baseplate has a protective coating comprised of an adhesive which is inert with respect to chemicals used in electroplating, said coating extending up to 50% of the web height.

22. The jig as claimed in claim 3, wherein an entire large metal baseplate made up of a plurality of individual baseplate has a protective coating comprised of an adhesive which is inert with respect to chemicals used in electroplating, said coating extending up to 50% of the peg length.

23. The jig as claimed in claim 5, wherein an entire large metal baseplate made up of a plurality of individual baseplate has a protective coating comprised of an adhesive which is inert with respect to the chemicals used in electroplating, said coating extending up to 50% of the web height.

* * * * *